(12) United States Patent
Isshiki

(10) Patent No.: US 9,496,485 B2
(45) Date of Patent: Nov. 15, 2016

(54) PIEZOELECTRIC MATERIAL, PIEZOELECTRIC ELEMENT, LIQUID EJECTING HEAD, LIQUID EJECTING APPARATUS, AND ULTRASONIC MEASURING APPARATUS

(71) Applicant: Seiko Epson Corporation, Tokyo (JP)

(72) Inventor: Tetsuya Isshiki, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/730,481

(22) Filed: Jun. 4, 2015

(65) Prior Publication Data

US 2015/0357552 A1 Dec. 10, 2015

(30) Foreign Application Priority Data

Jun. 5, 2014 (JP) .................................. 2014-117103

(51) Int. Cl.
| | |
|---|---|
| *B41J 2/045* | (2006.01) |
| *H01L 41/187* | (2006.01) |
| *B41J 2/14* | (2006.01) |
| *B41J 2/16* | (2006.01) |
| *H01L 41/08* | (2006.01) |
| *H01L 41/09* | (2006.01) |
| *H01L 41/318* | (2013.01) |

(52) U.S. Cl.
CPC ........ *H01L 41/1878* (2013.01); *B41J 2/14233* (2013.01); *B41J 2/161* (2013.01); *B41J 2/1623* (2013.01); *B41J 2/1628* (2013.01); *B41J 2/1629* (2013.01); *B41J 2/1631* (2013.01); *B41J 2/1632* (2013.01); *B41J 2/1635* (2013.01); *B41J 2/1642* (2013.01); *B41J 2/1646* (2013.01); *H01L 41/0815* (2013.01); *H01L 41/0973* (2013.01); *B41J 2002/14241* (2013.01); *B41J 2002/14419* (2013.01); *B41J 2002/14491* (2013.01); *H01L 41/318* (2013.01)

(58) Field of Classification Search
None
See application file for complete search history.

(56) References Cited

U.S. PATENT DOCUMENTS

| | | | | |
|---|---|---|---|---|
| 6,091,183 | A * | 7/2000 | Nishimura | H01L 41/187 310/358 |
| 2011/0050811 | A1* | 3/2011 | Wang | B41J 2/055 347/71 |
| 2011/0292133 | A1* | 12/2011 | Sasaki | B41J 2/14233 347/68 |

FOREIGN PATENT DOCUMENTS

JP 2009-252789 A 10/2009

* cited by examiner

*Primary Examiner* — Erica Lin
(74) *Attorney, Agent, or Firm* — Harness, Dickey & Pierce, P.L.C.

(57) ABSTRACT

A piezoelectric material is expressed as a mixed crystal including a complex oxide having a perovskite structure and a rhombohedral structure and a complex oxide having a perovskite structure and a tetragonal structure, and the molar ratio of the complex oxide having a rhombohedral structure to the complex oxide having a tetragonal structure (rhombohedral crystal/tetragonal crystal) is 0.54 to less than 1.20.

9 Claims, 8 Drawing Sheets

PIEZOELECTRIC MATERIAL, PIEZOELECTRIC ELEMENT, LIQUID EJECTING HEAD, LIQUID EJECTING APPARATUS, AND ULTRASONIC MEASURING APPARATUS

TECHNICAL FIELD

The present invention relates to a piezoelectric material, a piezoelectric element, a liquid ejecting head, a liquid ejecting apparatus, and an ultrasonic measuring apparatus.

BACKGROUND

Hitherto, piezoelectric elements have had a configuration in which a piezoelectric layer made of a piezoelectric material having an electromechanical conversion function is placed between two electrodes. Piezoelectric elements are mounted on liquid ejecting heads or liquid ejecting apparatuses as, for example, a flexure-mode actuator device and are also widely used in ultrasonic measuring apparatuses, various motors, sensors, memory devices and the like. As the piezoelectric material constituting the piezoelectric layer of the piezoelectric element, lead zirconate titanate (PZT) is known as a representative example. However, the development of a piezoelectric material in which the content of lead is suppressed has advanced from the viewpoint of a reduction in an environmental load.

For example, a piezoelectric material which is formed of a mixed crystal of $Bi(Fe,Mn)O_3$ and $Ba(Zr,Ti)O_3$ and expressed by composition formula $(1-x)Bi(Fe_{1-y}Mn_y)O_3-x Ba(Zr_uTi_{1-u})O_3$ where $0<x<0.40$, $0.01<y21\ 0.10$, and $0 \leq u 0.16$ is proposed (for example, see JP-A-2009-252789).

However, in a piezoelectric material in which the content of lead is suppressed as in PTL 1, it is difficult to suppress a leak current when a predetermined kind of metal is diffused in the electrode. Thus, in recent years in which a further increase in density and performance has been required for liquid ejecting heads, a piezoelectric material capable of reducing a leak current has been required. In addition, an improvement in durability with respect to repetitive application of a voltage is also required for a piezoelectric material, and how to provide a piezoelectric material having excellent reliability is a problem which is expected to be solved. Such a problem is also present not only in piezoelectric materials constituting piezoelectric layers of piezoelectric elements used in liquid ejecting heads, but also in piezoelectric materials constituting piezoelectric layers of piezoelectric elements mounted on other apparatuses including ultrasonic measuring apparatuses.

An object of the invention is to provide a piezoelectric material, a piezoelectric element, a liquid ejecting head, a liquid ejecting apparatus, and an ultrasonic measuring apparatus in which reliability can be improved in view of the circumstances.

SUMMARY

According to an aspect of the invention solving the above-mentioned problem, there is provided a piezoelectric material which is expressed as a mixed crystal including a complex oxide having a perovskite structure and a rhombohedral structure and a complex oxide having a perovskite structure and a tetragonal structure, in which the molar ratio of the complex oxide having a rhombohedral structure to the complex oxide having a tetragonal structure (rhombohedral crystal/tetragonal crystal) is 0.54 to less than 1.20.

According to the aspect, by controlling the components of the piezoelectric material with the complex oxide having a rhombohedral structure and the complex oxide having a tetragonal structure, the leak current can be reduced and durability with respect to repetitive application of a voltage can also be improved. Accordingly, reliability can be improved. Moreover, the load on the environment can also be reduced by suppressing the content of lead.

Here, it is preferable that the complex oxide having a rhombohedral structure is a complex oxide which contains Bi in an A-site of the perovskite structure and Fe in a B-site thereof, and the complex oxide having a tetragonal structure is formed of a complex oxide which contains Ba in an A-site of the perovskite structure and Ti in a B-site thereof, and a complex oxide which contains Bi and K in an A-site of the perovskite structure and Ti in a B-site thereof. According to this, by controlling the components of the piezoelectric material with the complex oxide having a rhombohedral structure and the complex oxide having a tetragonal structure, the content of a predetermined kind of metal is reduced, and thus the generation of cations (for example, $Fe^{2+}$) which may be a cause of a leak current can be suppressed. Therefore, reliability can be further improved by reducing the leak current.

Further, it is preferable that the piezoelectric material is expressed as a mixed crystal including $Bi(Fe,Mn)O_3$, $BaTiO_3$, and $(Bi,K)TiO_3$.

According to this, by controlling the components of the piezoelectric material with $Bi(Fe,Mn)O_3$, which is a complex oxide having a rhombohedral structure, and $BaTiO_3$ and $(Bi,K)TiO_3$, which are complex oxides having a tetragonal structure, charges of a predetermined kind of metal (for example, $Fe^{3+}$) are stabilized with Ti in $(Bi,K)TiO_3$, and the generation of cations (for example, $Fe^{2+}$) which may be a cause of a leak current can be further suppressed with Mn contained in $Bi(Fe,Mn)O_3$. Accordingly, the leak current is further reduced and reliability can thus be further improved.

Further, it is preferable that, the piezoelectric material is formed of a complex oxide having a composition expressed by the following Formula (1):

$$xBi(Fe,Mn)O_3\text{-}yBaTiO_3\text{-}z(Bi,K)TiO_3 \quad (1)$$

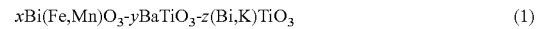

(where $0.35 \leq x < 0.55$, $0.20 \leq y23\ 0.35$, and $0.20 < z23\ 0.40$)

According to this, since the components of the piezoelectric material are controlled within an appropriate range, reliability can be securely improved.

According to still another aspect of the invention, there is provided a piezoelectric element, in which a first electrode, a piezoelectric layer made of the piezoelectric material according to any one of the aspects described above, and a second electrode are stacked on a substrate. According to the aspect, the leak current can be reduced and durability with respect to repetitive application of a voltage can also be improved. Accordingly, reliability can be improved. Moreover, the load on the environment can also be reduced by suppressing the content of lead.

According to still another aspect of the invention, there is provided a liquid ejecting head including the above-described piezoelectric element. According to the aspect, the leak current can be reduced and durability with respect to repetitive application of a voltage can also be improved. Accordingly, reliability can be improved and a liquid ejecting head in which excellent ejection characteristics can be maintained over a long period of time is provided. Moreover, the load on the environment can also be reduced by suppressing the content of lead.

According to still another aspect of the invention, there is provided a liquid ejecting apparatus including the above-described liquid ejecting head. According to the aspect, the leak current can be reduced and durability with respect to repetitive application of a voltage can also be improved. Accordingly, reliability can be improved and a liquid ejecting apparatus in which excellent ejection characteristics can be maintained over a long period of time is provided. Moreover, the load on the environment can also be reduced by suppressing the content of lead.

According to still another aspect of the invention, there is provided a ultrasonic measuring apparatus including the above-described piezoelectric element; and control means for measuring a subject using a signal based on at least one of ultrasonic waves transmitted by the piezoelectric element and ultrasonic waves received by the piezoelectric element. According to the aspect, the leak current can be reduced and durability with respect to repetitive application of a voltage can also be improved. Accordingly, reliability can be improved and an ultrasonic measuring apparatus in which excellent ultrasonic wave transmission and reception characteristics can be maintained over a long period of time is provided. Moreover, the load on the environment can also be reduced by suppressing the content of lead.

DETAILED DESCRIPTION

Embodiment 1

Figure 1:
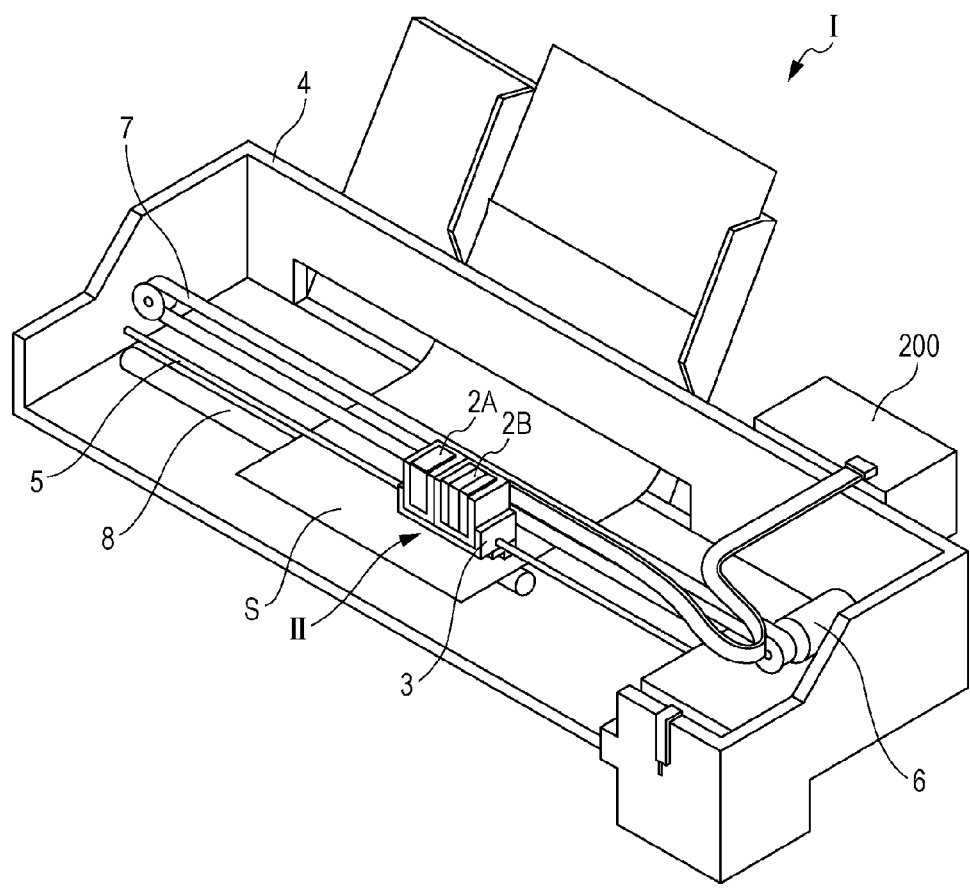
FIG. 1 is a diagram showing a schematic configuration of a recording apparatus according to Embodiment 1.

FIG. 1 shows an ink jet recording apparatus which is an example of a liquid ejecting apparatus according to Embodiment 1 of the invention.

As shown in the drawing, in an ink jet recording apparatus I, an ink jet recording head unit (head unit) II having a plurality of ink jet recording heads is detachably provided on cartridges 2A and 2B constituting ink supply means. A carriage 3 having the head unit II mounted thereon is provided on a carriage shaft 5 attached to an apparatus main body 4 so as to be movable in a shaft direction, and discharges, for example, a black ink composition and color ink compositions.

The carriage 3 having the head unit II mounted thereon is moved along the carriage shaft 5 by the transfer of the driving force of a driving motor 6 to the carriage 3 via a plurality of toothed wheels (not shown) and a timing belt 7. In the apparatus main body 4, a transport roller 8 is provided as transport means and a recording sheet S which is a recording medium such as paper is transported by the transport roller 8. The transport means for transporting a recording sheet S is not limited to the transport roller, and may be a belt, a drum, or the like.

According to this ink jet recording apparatus I, since the ink jet recording heads according to this embodiment are mounted, the leak current upon driving can be reduced and durability with respect to repetitive application of a voltage can also be improved. Therefore, reliability can be improved and excellent ejection characteristics can be maintained over a long period of time. Moreover, since the actuator device can be configured by suppressing the content of lead included in the piezoelectric element as the actuator device, that is, for example, with no content of lead, the load on the environment can also be reduced.

Figure 2:
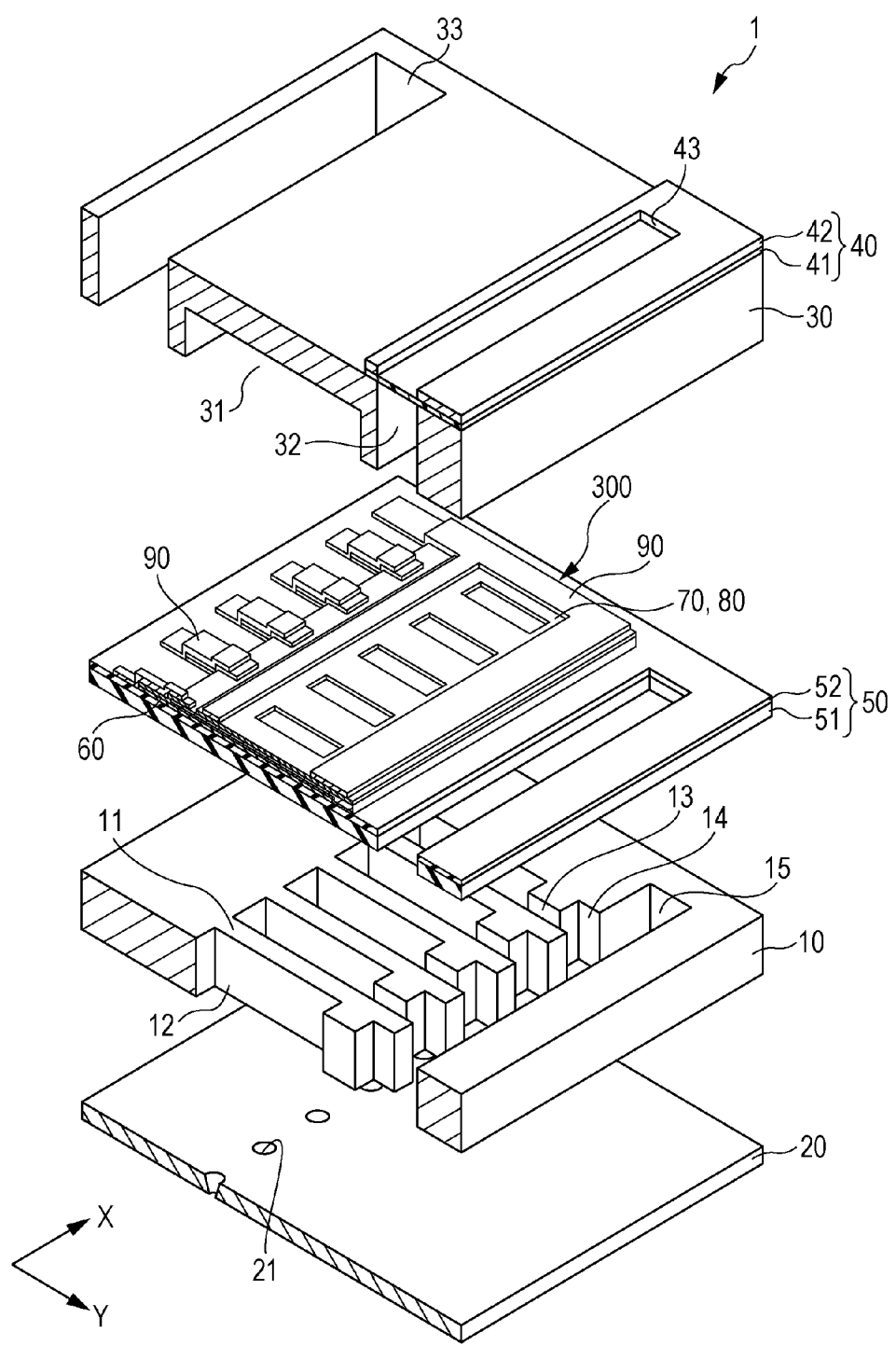
FIG. 2 is an exploded perspective view showing a recording head according to Embodiment 1.
Figure 3:
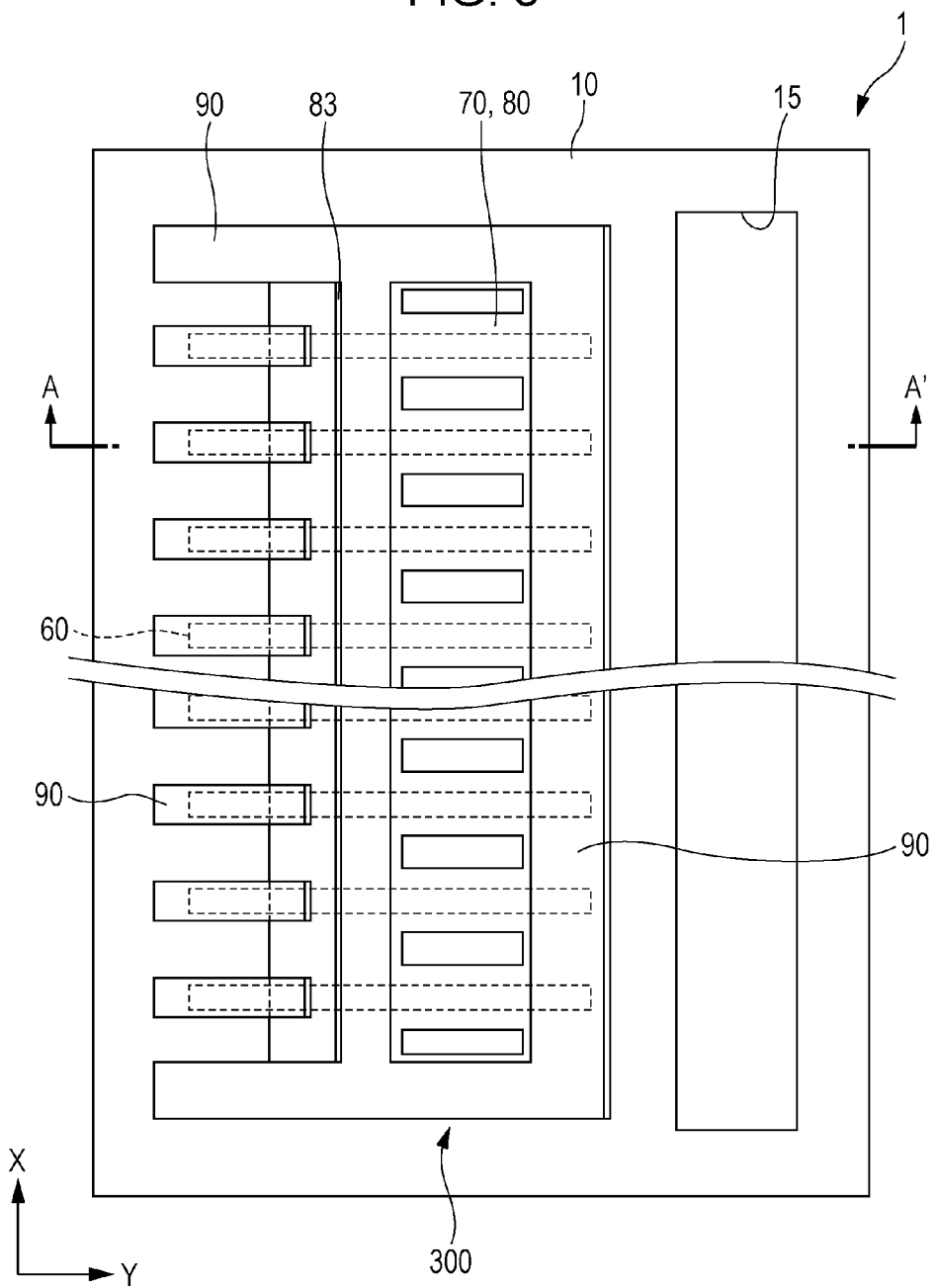
FIG. 3 is a plan view showing the recording head according to Embodiment 1.
Figure 4:
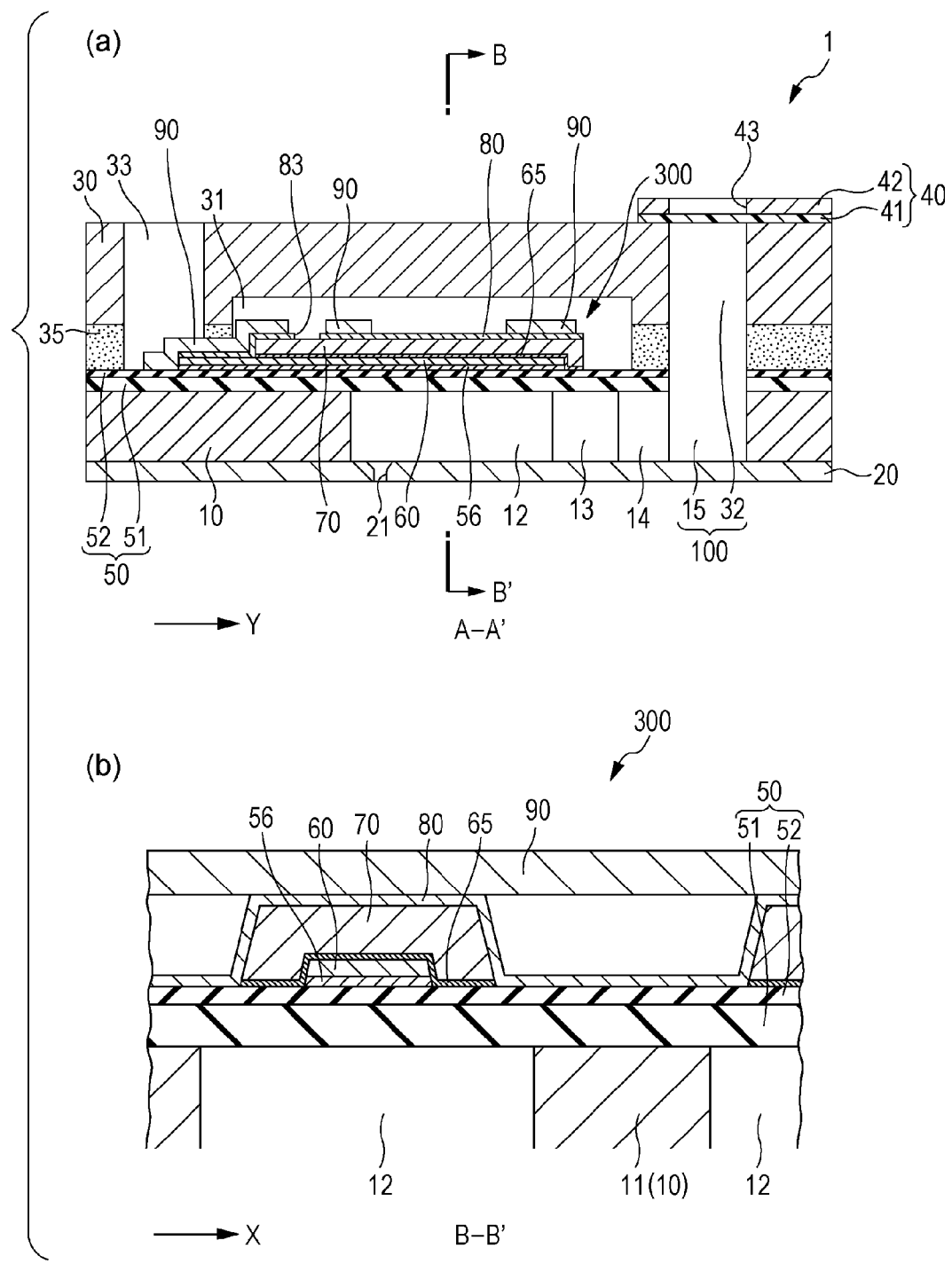
FIG. 4 shows cross-sectional views showing the recording head according to Embodiment 1.

An example of an ink jet recording head 1 mounted on the ink jet recording apparatus I will be described with reference to FIGS. 2 to 4. FIG. 2 is an exploded perspective view of the ink jet recording head which is an example of the liquid ejecting head according to this embodiment, and FIG. 3 is a plan view of a channel forming substrate on the piezoelectric element side. FIG. 4(a) is a cross-sectional view taken along line A-A' of FIG. 3, and FIG. 4(b) is a cross-sectional view taken along line B-B' of FIG. 4(a).

As shown in the drawings, a channel forming substrate 10 has a pressure generation chamber 12 formed therein. The pressure generation chamber 12 partitioned by a plurality of partition walls 11 is arranged in a direction in which a plurality of nozzle openings 21 discharging the same color ink are arranged. Hereinbelow, the direction in which the pressure generation chambers 12 are arranged in the channel forming substrate 10 will be referred to as a width direction or a first direction X, and a direction perpendicular to the first direction X will be referred to as a second direction Y.

An ink supply path 13 having an opening area reduced by narrowing one side of the pressure generation chamber 12 in the first direction X and a communication path 14 having almost the same width as the pressure generation chamber 12 in the first direction X are partitioned by the plurality of partition walls 11 on one end portion side of the pressure generation chamber 12 of the channel forming substrate 10 in the second direction Y. A communication portion 15 constituting a part of a manifold 100 which is an ink chamber common to the respective pressure generation chambers 12 is formed outside of the communication path 14 (on the opposite side to the pressure generation chamber 12 in the second direction Y). That is, in the channel forming substrate 10, a liquid channel formed of the pressure generation chambers 12, the ink supply paths 13, the communication paths 14, and the communication portion 15 is formed.

A nozzle plate 20 having nozzle openings 21 communicating with the respective pressure generation chambers 12 is bonded to one surface side of the channel forming substrate 10, that is, a surface where the liquid channels such as the pressure generation chambers 12 open by an adhesive, a thermal bonding film or the like. The nozzle openings 21 are arranged in the first direction X in the nozzle plate 20.

A vibrating plate 50 formed of an elastic film 51 made of $SiO_2$ (silicon dioxide) and the like and an insulating film 52 made of $ZrO_2$ (zirconium oxide) and the like is provided on the other side opposed to the one surface side of the channel forming substrate 10. However, the configuration of the vibrating plate 50 is not limited to the above-described example, and a part of the channel forming substrate 10 may be used as the elastic film by being subjected to thinning.

A first electrode 60 having a thickness of approximately 0.2 μm is provided over the insulating film 52 via an adhesion layer 56 made of TiO$_2$ (titanium oxide) and the like and having a thickness of approximately 10 μm to 50 μm, and a seed layer 65 having a thickness of approximately less than 20 nm is provided so as to overlap the adhesion layer 56, the first electrode 60, and the vibrating plate 50. The seed layer 65 is provided with a piezoelectric layer 70 having a thickness of approximately 3.0 μm or less, and preferably approximately 0.5 μm to 1.5 μm, and a second electrode 80 having a thickness of approximately 0.05 μm. A piezoelectric element 300 is not limited to a configuration in which the respective layers are directly adjacent to each other, and also includes a configuration in which other members are interposed between the layers. The adhesion layer 56 and the seed layer 65 may be omitted.

In this embodiment, the piezoelectric element 300 and the vibrating plate 50 which is displaced by driving of the piezoelectric element 300 will be both referred to as an actuator device. A portion including the vibrating plate 50 and the first electrode 60 acts as a vibrating plate, but the vibrating plate is not limited thereto. Only the first electrode 60 may act as a vibrating plate without provision of one or both of the elastic film 51 and the insulating film 52. In addition, the piezoelectric element 300 itself may substantially double as the vibrating plate. When the first electrode 60 is directly provided on the channel forming substrate 10, the first electrode 60 is preferably protected with an insulating protective film or the like so as to prevent conduction of the first electrode 60 and an ink.

In such a piezoelectric element 300, one of the electrodes generally acts as a common electrode, and the other electrode acts as an individual electrode by patterning for each pressure generation chamber 12. In this embodiment, the second electrode 80 is formed continuously over the plurality of pressure generation chambers 12 and acts as a common electrode, and the first electrode 60 acts as an individual electrode. However, there is no problem even when the electrodes are reversed due to the circumstances of the driving circuit or the like.

Hereinafter, the piezoelectric element 300 of this embodiment will be described in more detail. The first electrode 60 constituting an individual electrode is formed with a width smaller than the width of the pressure generation chamber 12 in the first direction X of the pressure generation chamber. In the second direction Y, both end portions of the first electrode 60 are provided to extend up to the outside of the pressure generation chamber 12.

The material of the first electrode 60 is not particularly limited as long as it has a conductive property. Noble metal such as platinum (Pt) or iridium (Ir) is representatively used. The material of the second electrode 80 is also not particularly limited as long as it has a conductive property, and it is possible to appropriately select and use one from among materials usable as the first electrode 60. The second electrode 80 is provided on the side opposite to the first electrode 60 of the piezoelectric layer 70 and is configured as a common electrode.

The seed layer 65 is formed over an upper surface and a side surface of the first electrode 60, a side surface of the adhesion layer 56, and the vibrating plate 50. Such a seed layer 65 is configured to be formed of a complex oxide having a perovskite structure. In the A-site of the perovskite structure, that is, ABO$_3$ structure, oxygen is 12-coordinated, and in the B-site thereof, oxygen is 6-coordinated to form an octahedron.

The seed layer 65 has the same perovskite structure as the piezoelectric material of the piezoelectric layer 70, and thus has piezoelectric characteristics. Here, the seed layer 65 is formed of a complex oxide having a perovskite structure and is expressed as bismuth manganite (BiMnO$_3$). When the seed layer 65 is configured to be formed of a complex oxide containing, for example, Bi in the A-site and Mn in the B-site as above, the seed layer 65 and the piezoelectric layer 70 may act together as the piezoelectric layer in the relationship with the constituent material of the piezoelectric layer 70 of this embodiment containing Bi and Mn in the same manner. The boundary between the seed layer 65 and the piezoelectric layer 70 is not always required to be distinct.

In the case of the seed layer 65, a complex oxide in which a part of elements in the A-site and the B-site is substituted with other elements may be used. For example, elements such as Ba and La (lanthanum) may further exist other than Bi in the A-site, and elements such as Ti, Zr (zirconium), and Nb (niobium) may further exist other than Mn in the B-site. The seed layer 65 also includes a complex oxide having a composition deviated from the stoichiometric composition (ABO$_3$) due to the deficiency or excess of the element.

Such a seed layer 65 functions as an orientation control layer which preferentially orients the piezoelectric layer 70 formed thereon to a predetermined crystal plane, for example, a (100) plane. Therefore, the crystalline property of the piezoelectric layer 70 is controlled and reliability can thus be easily improved. The seed layer 65 has a thickness of less than 20 nm. When the seed layer 65 is made very thin as above, voltage distribution to the seed layer 65 is reduced, and thus a voltage is efficiently applied to the piezoelectric layer 70.

Here, the piezoelectric layer 70 of this embodiment is made of a piezoelectric material which is expressed as a mixed crystal including a complex oxide having a perovskite structure and a rhombohedral structure and a complex oxide having a perovskite structure and a tetragonal structure, and in which the molar ratio of the complex oxide having a rhombohedral structure to the complex oxide having a tetragonal structure (rhombohedral crystal/tetragonal crystal) is 0.54 to less than 1.20.

According to this, the leak current upon driving can be reduced by controlling the components of the piezoelectric material, and thus various negative influences such as a drop of the voltage on the piezoelectric layer 70 due to the leak current can be suppressed. Furthermore, by controlling the components of the piezoelectric material as described above, fracture resistance (durability) with respect to repetitive application of a voltage can also be improved. Therefore, reliability can be improved. Moreover, the load on the environment can also be reduced by suppressing the content of lead. As in the case of the seed layer 65, in the complex oxide having a perovskite structure, that is, ABO$_3$ structure, oxygen is 12-coordinated in the A-site and oxygen is 6-coordinated in the B-site to form an octahedron.

The complex oxide having a rhombohedral structure is formed of a complex oxide which contains Bi in the A-site of the perovskite structure and Fe in the B-site thereof, and the complex oxide having a tetragonal structure is formed of a complex oxide which contains Ba in the A-site of the perovskite structure and Ti in the B-site thereof, and a complex oxide which contains Bi and K in the A-site of the perovskite structure and Ti in the B-site thereof.

That is, in this embodiment, within the above-described molar ratio (rhombohedral crystal/tetragonal crystal) range, complex oxides having a crystalline structure but different compositions are used. Accordingly, the content of a predetermined kind of metal, e.g., a kind of metal which can generate, for example, cations ($Fe^{2+}$ and the like) which may be a cause of a leak current can be reduced, and oxygen deficiency and the like derived from the deficiency of a predetermined kind of metal (Bi and the like) can be suppressed. Thus, reliability can be improved.

The compositions of the complex oxide having a rhombohedral structure and the complex oxide having a tetragonal structure are not limited to the above-described examples, and a part of the A-site or the B-site may be substituted with various elements. For example, in the complex oxide having a rhombohedral structure, a part of the B-site may be substituted with manganese (Mn).

Accordingly, a material expressed as a mixed crystal including $Bi(Fe,Mn)O_3$, $BaTiO_3$, and $(Bi,K)TiO_3$ is exemplified as the piezoelectric material. In this material, the bismuth manganate ferrate ($Bi(Fe,Mn)O_3$) is included as a complex oxide having a rhombohedral structure, and the barium titanate ($BaTiO_3$) and the bismuth potassium titanate ($(Bi,K)TiO_3$) are included as a complex oxide having a tetragonal structure. According to this, charges of a predetermined kind of metal (for example, $Fe^{3+}$) are stabilized by Ti in $(Bi,K)TiO_3$, and the generation of cations (for example, $Fe^{2+}$) which may be a cause of a leak current can be further suppressed by Mn included in $Bi(Fe, Mn) O_3$.

Particularly, in this embodiment, a material formed of a complex oxide having a composition expressed by the following Formula (1) is used as the piezoelectric material, and reliability can be securely improved by controlling the components of the piezoelectric material within an appropriate range.

$$xBi(Fe,Mn)O_3\text{-}yBaTiO_3\text{-}z(Bi,K)TiO_3 \qquad (1)$$

($0.35 \leq x < 0.55$, $0.20 \leq y \leq 0.35$, $0.20 < z \leq 0.40$)

The complex oxide having a perovskite structure also includes a complex oxide having a composition deviated from the stoichiometric composition due to the deficiency or excess and a complex oxide in which a part of elements is substituted with other elements. That is, as long as the perovskite structure is acquired, an inevitable deviation in composition due to lattice mismatch, oxygen deficiency, or the like and substitution of a part of elements are permitted. When a stoichiometric ratio is 1, a material in which the stoichiometric ratio is 0.85 to 1.20 is permitted.

Accordingly, for example, in the above-described Bi(Fe,Mn)$O_3$, a part of Bi in the A-site may be substituted with Ba, La, Sm (samarium), Ce (cerium) and the like, and a part of Fe and Mn in the B-site may be substituted with Al (aluminum), Co (cobalt) and the like. In the above-described $BaTiO_3$, a part of Ba in the A-site may also be substituted with Mn, La, Sm, Ce and the like, and a part of Ti in the B-site may also be substituted with Al, Co and the like. Furthermore, in the above-described $(Bi,K)TiO_3$, a part of Bi and K in the A-site may also be substituted with Ba, Na, Mn, La, Sm, Ce and the like, and a part of Ti in the B-site may also be substituted with Al, Co and the like. In the case of these complex oxides containing other elements, these are also preferably configured to have a perovskite structure, and through substitution of a part of elements, leakage characteristics may be improved in the same manner as in the case of Mn.

Such a piezoelectric layer 70 is provided continuously in the first direction X so as to have a predetermined width in the second direction Y. The width of the piezoelectric layer 70 in the second direction Y is larger than a length of the pressure generation chamber 12 in the second direction Y, and the piezoelectric layer 70 is provided up to the outside of the pressure generation chamber 12 in the second direction Y of the pressure generation chamber 12.

An end portion of the piezoelectric layer 70 on the side of the ink supply path 13 in the second direction Y of the pressure generation chamber 12 is positioned outside an end portion of the first electrode 60. That is, the end portion of the first electrode 60 is covered with the piezoelectric layer 70. An end portion of the piezoelectric layer 70 on the side of the nozzle openings 21 is positioned inside of the end portion of the first electrode 60 (on the side of the pressure generation chamber 12), and the end portion of the first electrode 60 on the side of the nozzle openings 21 is not covered with the piezoelectric layer 70.

A lead electrode 90 is connected to the first electrode 60 and the second electrode 80 of the piezoelectric element 300. Such a lead electrode 90 can be formed over the whole one surface of the channel forming substrate 10 and be then patterned into a predetermined shape.

A protective substrate 30 which protects the piezoelectric element 300 is bonded to the channel forming substrate 10 having the piezoelectric element 300 formed thereon by an adhesive 35. The protective substrate 30 is provided with a piezoelectric element protective portion 31 which is a concave portion which defines the space in which the piezoelectric element 300 is accommodated. In addition, the protective substrate 30 is provided with a manifold portion 32 constituting a part of the manifold 100. The manifold portion 32 is formed in the width direction of the pressure generation chamber 12 through the protective substrate 30 in the thickness direction (in a direction perpendicular to the first direction X and the second direction Y), and communicates with the communication portion 15 of the channel forming substrate 10 as described above.

The protective substrate 30 is provided with a through hole 33 passing through the protective substrate 30 in the thickness direction. The lead electrode 90 connected to the first electrode 60 of each active portion is provided to be exposed to the inside of the through hole 33.

A compliance substrate 40 formed of a sealing film 41 and a stationary plate 42 is bonded to the protective substrate 30, and one surface of the manifold portion 32 is sealed with the sealing film 41. A region in the stationary plate 42 opposed to the manifold 100 is an opening portion 43 completely removed in the thickness direction, and one surface of the manifold 100 is sealed only with the sealing film 41.

In such an ink jet recording head 1 of this embodiment, an ink is introduced from an ink inlet connected to external ink supply means (not shown) to fill the inside from the manifold 100 to the nozzle openings 21 with the ink. Then, a voltage is applied between the first electrode 60 and the second electrode 80 corresponding to the pressure generation chamber 12 in accordance with a recording signal from a driving circuit, and the vibrating plate 50, the adhesion layer 56, the first electrode 60, the seed layer 65, and the piezoelectric layer 70 are deflection-deformed to increase the pressure in each pressure generation chamber 12 to thus eject ink droplets from the nozzle openings 21.

Figure 5:
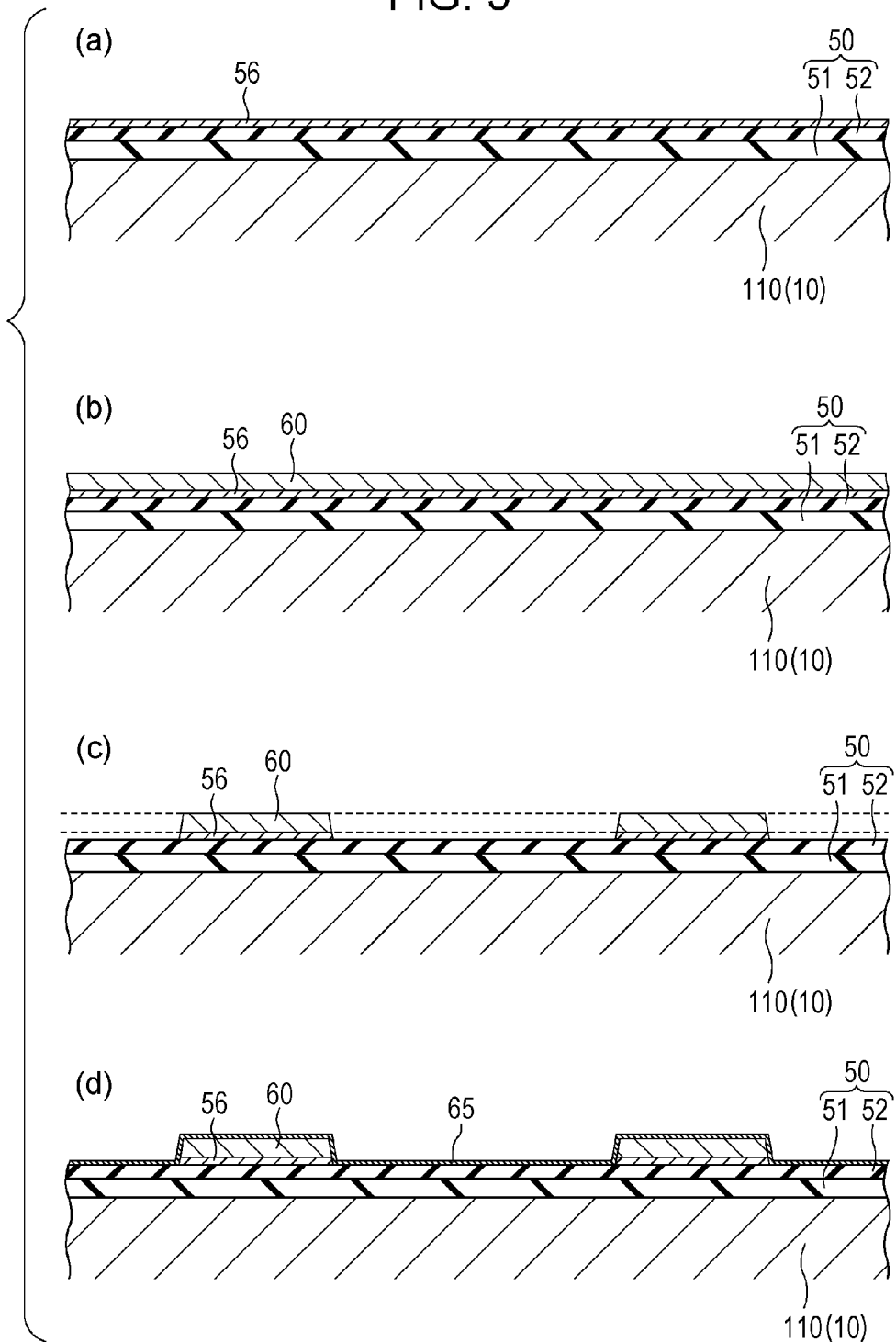
FIG. 5 shows cross-sectional views showing an example of the manufacturing of the recording head according to Embodiment 1.
Figure 6:
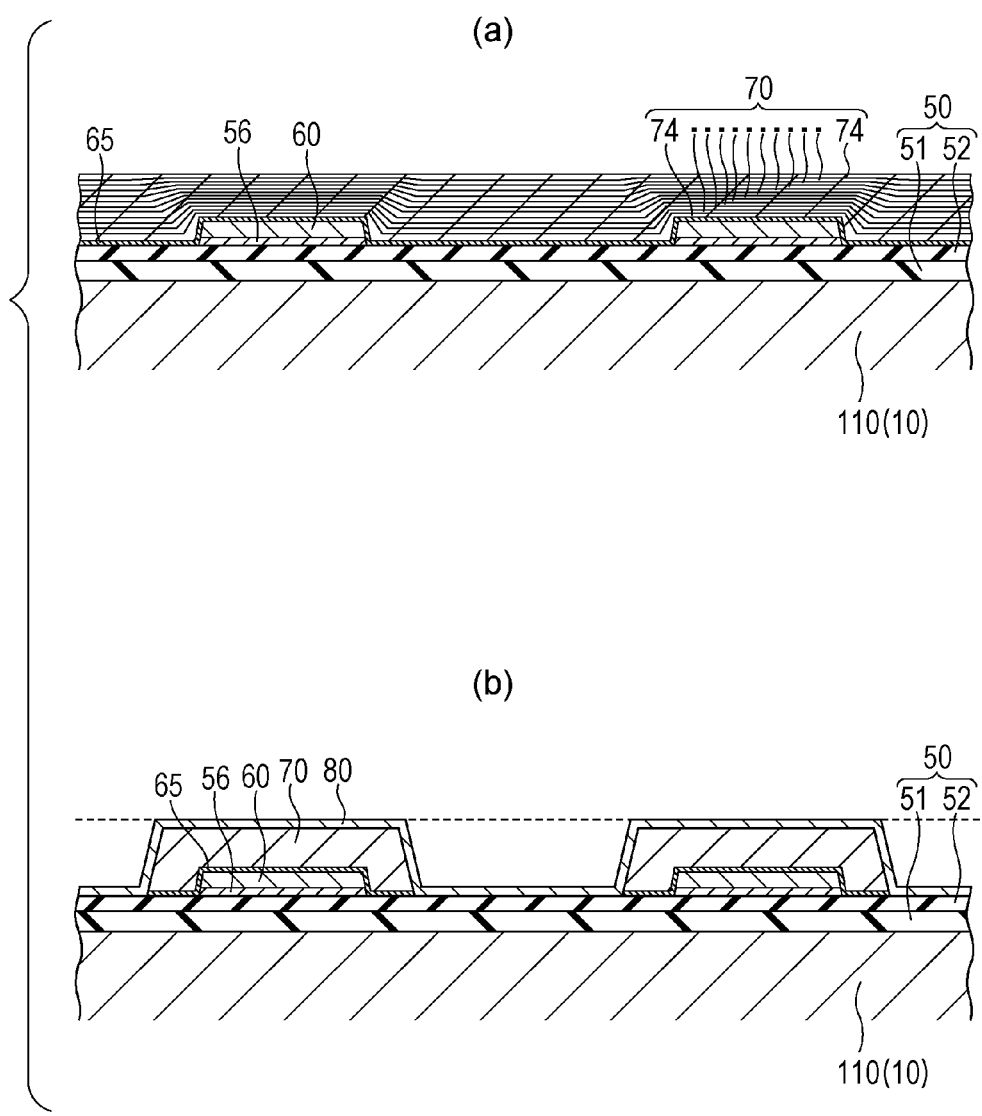
FIG. 6 shows cross-sectional views showing an example of the manufacturing of the recording head according to Embodiment 1.

Next, an example of a method of manufacturing an ink jet recording head of this embodiment will be described with reference to FIGS. 5 and 6.

First, as shown in FIG. 5(a), an elastic film 51 made of silicon dioxide and the like is formed on a surface of a wafer for a channel forming substrate, and an insulating film 52 made of zirconium oxide and the like is formed on the elastic film 51 to configure a vibrating plate 50. Next, an adhesion layer 56 made of titanium oxide and the like is formed on the insulating film 52 through a sputtering method, thermal oxidation, or the like.

Next, as shown in FIG. 5(b), a first electrode 60 made of platinum is formed on the adhesion layer 56 through a sputtering method, a vapor deposition method, or the like. Next, as shown in FIG. 5(c), the adhesion layer 56 and the first electrode 60 are simultaneously subjected to patterning using a resist (not shown) having a predetermined shape as a mask on the first electrode 60.

Next, as shown in FIG. 5(d), the resist is detached, and then a seed layer 65 is formed over the first electrode 60, the adhesion layer 56, and the vibrating plate 50. The seed layer 65 can be formed using, for example, a metal-organic decomposition (MOD) method in which a precursor solution containing metal complexes is applied to form a seed layer precursor film and the film is dried and further baked at a high temperature to obtain a seed layer 65 formed of a metal oxide, or a chemical solution method such as a sol-gel method, that is, a liquid phase method. The seed layer 65 can also be formed using a laser ablation method, a sputtering method, a pulse laser deposition (PLD) method, a CVD method, an aerosol deposition method, or the like. In this embodiment, the seed layer 65 is formed to be composed of one layer, but may be formed to be composed of a plurality of layers.

Next, as shown in FIG. 6(a), a piezoelectric layer 70 is formed by forming a plurality of piezoelectric films 74 on the seed layer 65. The piezoelectric film 74 can be formed in the same manner as in the case of the seed layer 65 using, for example, a MOD method in which a solution containing metal complexes is applied, dried, and degreased to obtain a piezoelectric film 74, or a chemical solution method such as a sol-gel method. The piezoelectric film 74 can also be formed using a laser ablation method, a sputtering method, a pulse laser deposition (PLD) method, a CVD method, an aerosol deposition method, or the like.

As a specific example of a procedure for forming the piezoelectric film 74 using a chemical solution method, first, a composition for forming an oxide layer (precursor solution) formed of a MOD solution or a sol containing metal complexes containing Bi, Fe, Ba, K, and Ti is applied to form a piezoelectric precursor film (not shown) on the seed layer 65 (application process).

The precursor solution to be applied is a solution obtained by mixing metal complexes for forming a piezoelectric precursor film containing Bi, Fe, Ba, K, and Ti by baking, and dissolving or dispersing the resulting mixture in an organic solvent. In addition, when forming a piezoelectric precursor film containing Mn, a precursor solution containing a metal complex having Mn is used. Regarding the mixing ratio of the metal complexes having metal complexes containing Bi, Fe, Mn, Ba, K, and Ti, respectively, the mixing may be performed so as to mix the respective metals at a desired molar ratio. Examples of the metal complex containing Bi include bismuth 2-ethylhexanoate and bismuth acetate. Examples of the metal complex containing Fe include iron 2-ethylhexanoate, ferric acetate, and tris(acetylacetonato)iron. Examples of the metal complex containing Mn include manganese 2-ethylhexanoate and manganese acetate. Examples of the metal complex containing Ba include barium acetate, barium isopropoxide, barium 2-ethylhexanoate, and barium acetylacetonate. Examples of the metal complex containing K include potassium ethoxide, potassium 2-ethylhexanoate, potassium acetate, potassium acetylacetonate, and potassium tert-butoxide. Examples of the metal complex containing Ti include titanium 2-ethylhexanoate and titanium acetate. Examples of the solvent of the precursor solution include propanol, butanol, pentanol, hexanol, octanol, ethylene glycol, propylene glycol, octane, decane, cyclohexane, xylene, toluene, tetrahydrofuran, acetic acid, and octylic acid.

Next, this piezoelectric precursor film is dried for a certain length of time through heating to a predetermined temperature of, for example, 130° C. to 180° C. (drying process). Next, the dried piezoelectric precursor film is held for a certain length of time through heating to a predetermined temperature of, for example, 300° C. to 400° C. (degreasing process). Next, the piezoelectric precursor film is crystallized by being held for a certain length of time through heating to a predetermined temperature of, for example, 650° C. to 800° C. to form a piezoelectric film 74 (baking process). Examples of the heater which is used in the drying process, the degreasing process, and the baking process include a rapid thermal annealing (RTA) device which performs heating by irradiation from an infrared lamp, and a hot plate. The above-described application process, drying process, and degreasing process, or application process, drying process, degreasing process, and baking process are repeated a plurality of times in accordance with a desired thickness and the like to form a piezoelectric layer 70 formed of, for example, 12 piezoelectric films 74.

As shown in FIG. 6(b), the piezoelectric layer 70 and the seed layer 65 are subjected to patterning corresponding to each pressure generation chamber 12, and a second electrode 80 is formed on one surface side of the wafer 110 for a channel forming substrate (the surface side where the piezoelectric layer 70 is formed), that is, over an upper surface and a side surface of the piezoelectric layer 70 and the vibrating plate 50. So-called photolithography can be used for patterning. However, the patterning may also be performed through dry etching such as reactive ion etching or ion milling, wet etching, or the like.

Figure 7:
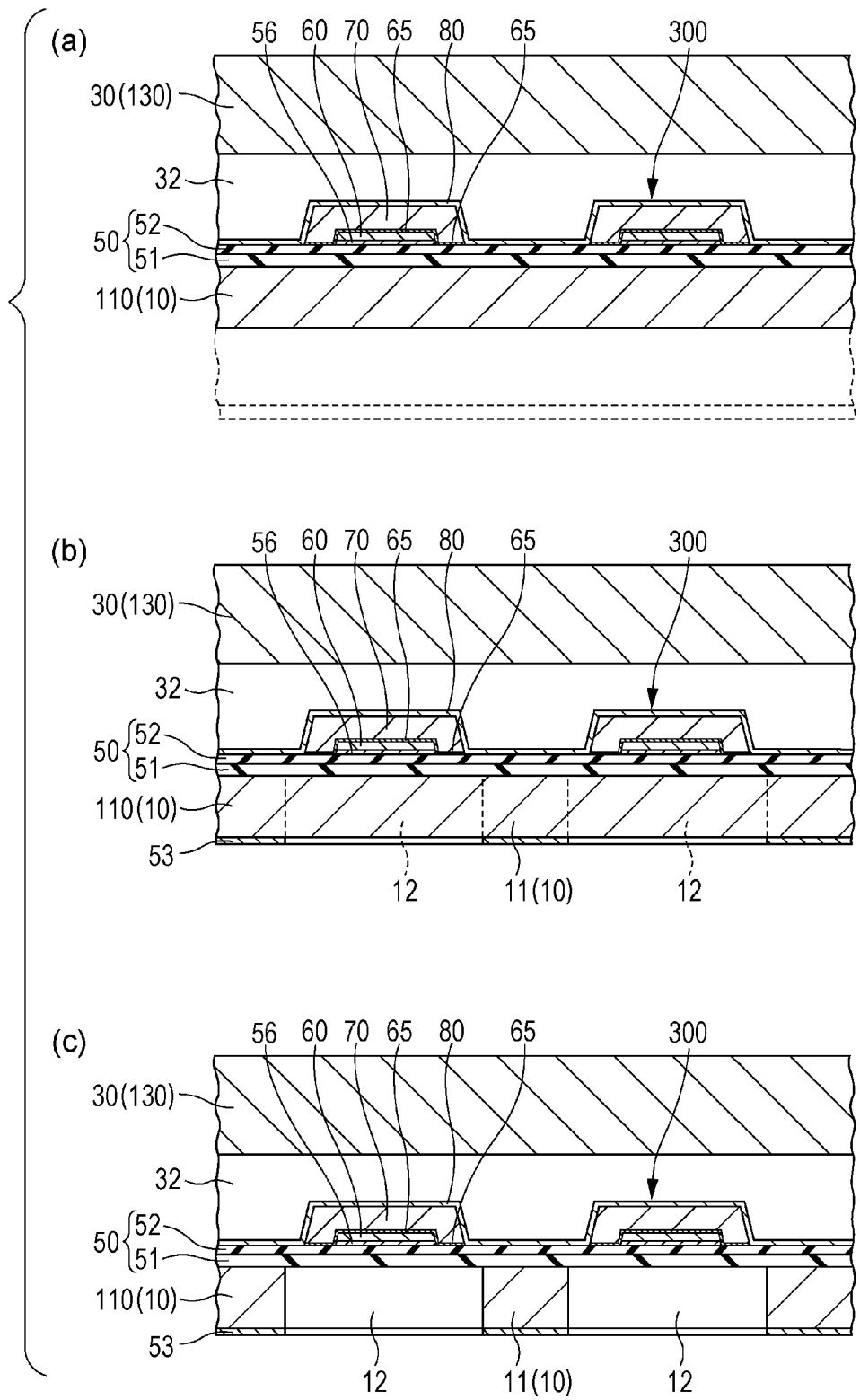
FIG. 7 shows cross-sectional views showing an example of the manufacturing of the recording head according to Embodiment 1.

Next, a lead electrode 90 is formed and patterning into a predetermined shape is performed. As shown in FIG. 7(a), a wafer 130 for a protective substrate is bonded to the side of piezoelectric elements 300 of the wafer 110 for a channel forming substrate via an adhesive (reference number: 35 in FIG. 2), and then the wafer 110 for a channel forming substrate is thinned into a predetermined thickness. Thereafter, as shown in FIG. 7(b), a new mask film 53 is formed on the wafer 110 for a channel forming substrate and patterning into a predetermined shape is performed. As shown in FIG. 7(c), the wafer 110 for a channel forming substrate is subjected to anisotropic etching (wet etching) using an alkaline solution such as KOH via the mask film 53.

Thereafter, the pressure generation chambers 12 corresponding to the piezoelectric elements 300, the ink supply paths 13, the communication paths 14, the communication portion 15 and the like shown in FIG. 2 are formed in the usual manner, and unnecessary portions in outer circumferential portions of the wafer 110 for a channel forming substrate and the wafer 130 for a protective substrate are removed by cutting by dicing or the like. A nozzle plate 20 having nozzle openings 21 is bonded to a surface of the wafer 110 for a channel forming substrate opposite to the wafer 130 for a protective substrate, a compliance substrate 40 is bonded to the wafer 130 for a protective substrate, and the wafer 110 for a channel forming substrate and the like are divided into a channel forming substrate 10 having a size of one chip and the like to make an ink jet recording head 1 of this embodiment.

EXAMPLES

Hereinafter, the invention will be described in more detail with examples. The invention is not limited to the following examples.

Example 1

Production of Substrate with Electrode

A silicon substrate was oxidized to form an elastic film 51 formed of a silicon dioxide film on a surface. Next, Zr-sputtering was performed on the elastic film 51 and an oxidation treatment was performed thereon in an oxidizing furnace to form an insulating film 52 made of zirconium oxide. A titanium film was formed on the insulating film 52, and subjected to thermal oxidation to form an adhesion layer 56 made of titanium oxide. Next, a first electrode 60 formed of a platinum film was formed through a RF magnetron sputtering method on the adhesion layer 56, and thus a first substrate with an electrode was obtained.

<Production of Seed Layer>

Next, a seed layer 65 was produced on the first electrode 60. The process is as follows. First, n-octane solutions of bismuth 2-ethylhexanoate and manganese 2-ethylhexanoate were mixed to prepare a precursor solution for a seed layer. Then, the precursor solution for a seed layer was drawn into a micropipette and added dropwise to the substrate set in a spin coater. A seed layer precursor film was formed by rotating the substrate (process of applying precursor solution for seed layer), and then dried for 3 minutes at 180° C. on a hot plate (seed layer drying process). Next, an amorphous film was formed by performing degreasing for 3 minutes at 350° C. (seed layer degreasing process), and baked for 5 minutes at 700° C. using a lamp annealing furnace (seed layer baking process). Through the above processes, the seed layer 65 made of bismuth manganite (BiMnO$_3$) was formed.

<Production of Piezoelectric Layer>

Next, a piezoelectric layer 70 was produced on the seed layer 65. The process is as follows. First, n-octane solutions of bismuth 2-ethylhexanoate, barium 2-ethylhexanoate, iron 2-ethylhexanoate, manganese 2-ethylhexanoate, magnesium 2-ethylhexanoate, and titanium 2-ethylhexanoate were mixed to form a composition of Table 1, and thus a precursor solution for a piezoelectric layer was prepared. A piezoelectric film 74 was formed on the seed layer 65 by rotating the substrate (application process), and then dried for 3 minutes at 180° C. on a hot plate (drying process). Next, degreasing was performed for 3 minutes at 350° C. (degreasing process) and baking was performed for 5 minutes at 750° C. using a lamp annealing furnace (baking process). Then, the process ranging from the application to the degreasing was repeated 2 times in the same manner, and then baking was performed for 5 minutes at 750° C. using a lamp annealing furnace. The above-described processes were repeated 5 times to form the piezoelectric layer 70 made of Bi(Fe,Mn)O$_3$, BaTiO$_3$, and (Bi,K)TiO$_3$.

<Production of Second Electrode>

An indium film was formed through a RF magnetron sputtering method on the prepared piezoelectric layer 70 to serve as a second electrode 80. A piezoelectric element 300 of Example 1 was obtained through the above processes.

Examples 2 to 5

Piezoelectric elements of Examples 2 to 5 were obtained through the same processes as in Example 1, except that piezoelectric materials having different compositions of Bi, Fe, Mn, Ba, K, and Ti from that of Example 1 as shown in Table 1 were used.

Comparative Example 1

A piezoelectric element of Comparative Example 1 was obtained through the same processes as in Example 1, except that a piezoelectric material described in Table 1, containing no K, that is, with no content of K, was used.

The composition ratios of the piezoelectric materials and the test results of the examples and the comparative example are shown in Table 1. The ratio of x:y:z in Table 1 corresponds to the ratio of x:y:z in the composition expressed by the following Formula (1). Bismuth manganate ferrate (Bi(Fe,Mn)O$_3$) which is a complex oxide having a rhombohedral structure is abbreviated as BFM, and barium titanate (BaTiO$_3$) and bismuth potassium titanate ((BiK)TiO$_3$) which are complex oxides having a tetragonal structure are abbreviated as BT and BKT, respectively.

[Formula 1]

$$x\text{Bi}(\text{Fe},\text{Mn})\text{O}_3\text{-}y\text{BaTiO}_3\text{-}z(\text{Bi},\text{K})\text{TiO}_3 \qquad (1)$$

Test Examples

I-V Characteristics

Figure 8:
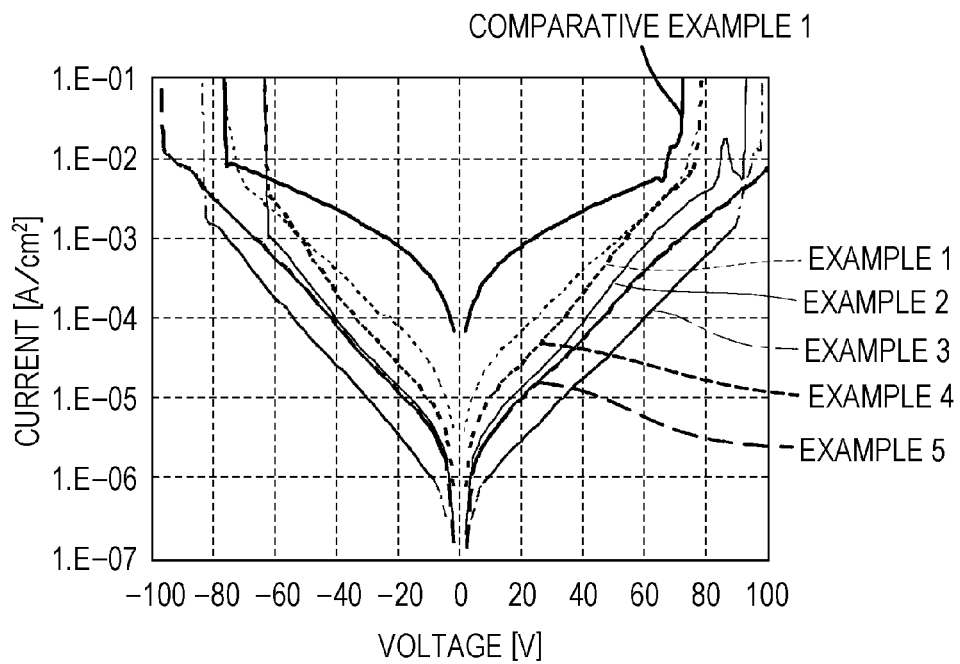
FIG. 8 is a diagram showing current (I)-voltage (V) characteristics in examples and a comparative example.

A voltage of ±100 V was applied to the piezoelectric elements of Examples 1 to 5 and Comparative Example 1 to evaluate the relationship between a current (I) and a voltage (V). The measurement was performed using "4140B" manufactured by Hewlett-Packard Company under the atmosphere with a holding time of 2 seconds upon measurement. The measurement results are shown in FIG. 8 and in Table 1. It was found that there is a tendency that in the piezoelectric elements of Examples 1 to 5, the current density (leak current) is smaller than in Comparative Example 1. That is, it was found that according to Examples 1 to 5, the leak current can be further reduced than in Comparative Example 1. As is obvious from Table 1, it was found that the leak current can be reduced by one digit in Example 1, by two digits in Examples 2, 4, and 5, and by three digits in Example 3, with respect to Comparative Example 1.

<Durability Test>

Figure 9:
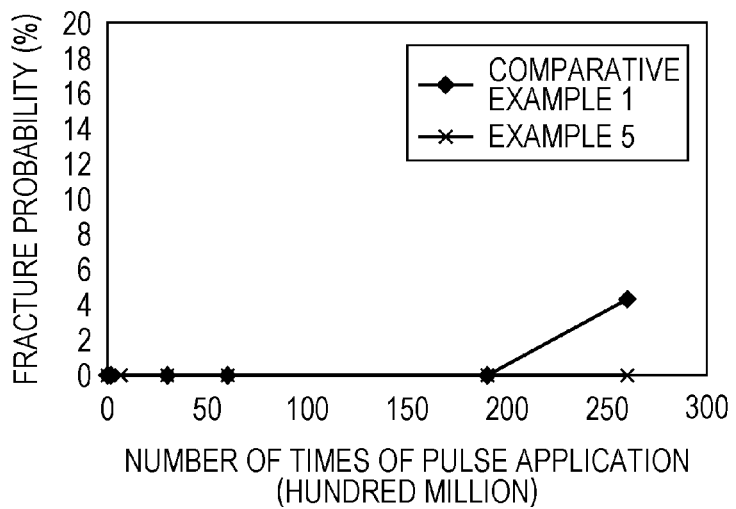
FIG. 9 is a diagram showing test results of fracture resistance with respect to repetitive application of a pulse in the example and the comparative example.

Evaluation of fracture resistance (durability) with respect to repetitive application of a voltage was performed on the piezoelectric elements of Example 5 and Comparative Example 1. The results of the measurement of the fracture probability when a rectangular pulse of 0 V to 45 V is repeatedly applied at a frequency of 50 kHz are shown in FIG. 9. The piezoelectric element of Example 5 was found to have more excellent fracture resistance with respect to the repetitive application of a voltage than Comparative Example 1. That is, it was confirmed that the fracture probability is maintained at a very low level in an initial stage in both of Example 5 and Comparative Example 1, but an increase in fracture probability is confirmed with the repetitive application in Comparative Example 1 and the fracture probability can be maintained at a very low level as in the initial stage in Example 5.

crystal effect caused by the formation of quantum dots, and optical filters using optical interference of a thin film. In addition, the invention can also be applied to piezoelectric elements which are used as a sensor and piezoelectric elements which are used as a ferroelectric memory. Examples of the sensor in which the piezoelectric element is used include infrared sensors, ultrasonic sensors, heat-sensitive sensors, pressure sensors, pyroelectric sensors, and gyro sensors (angular velocity sensors).

The piezoelectric element described in the above-described Embodiment 1 can also be appropriately used as a ferroelectric element. Examples of the ferroelectric element which can be appropriately used include ferroelectric transistors (FeFET), ferroelectric arithmetic circuits (FeLogic), and ferroelectric capacitors. Furthermore, the piezoelectric element described in the above-described Embodiment 1 can be appropriately used as a pyroelectric element since it exhibits good pyroelectric characteristics. Examples of the pyroelectric element which can be appropriately used include temperature detectors, living body detectors, infrared detectors, terahertz detectors, and heat-electricity converters.

TABLE 1

| | Rhombohedral | Tetragonal | | | | Leak Current |
|---|---|---|---|---|---|---|
| | x (BFM) | y (BT) | z (BKT) | Rhombohedral/ Tetragonal | Leak Current $(A/cm^2)$ | (relative value) |
| Example 1 | 54.5 | 25 | 20.5 | 54.5/45.5(1.198) | $1.4 \times 10^{-3}$ | 0.11 |
| Example 2 | 45 | 25 | 30 | 45/55(0.82) | $1.5 \times 10^{-4}$ | 0.023 |
| Example 3 | 35 | 25 | 40 | 35/65(0.54) | $6.7 \times 10^{-6}$ | 0.0048 |
| Example 4 | 48 | 20 | 32 | 48/52(0.92) | $6.4 \times 10^{-5}$ | 0.046 |
| Example 5 | 42 | 30 | 28 | 42/58(0.72) | $2.2 \times 10^{-5}$ | 0.016 |
| Comparative Example 1 | 75 | 25 | 0 | 75/25(3.0) | $1.4 \times 10^{-3}$ | 1.0 |

Other Embodiments

Although one embodiment of the invention has been described as above, the invention is not limited to the above description. For example, a silicon single crystal substrate has been exemplified as the channel forming substrate 10, but the channel forming substrate 10 is not particularly limited thereto. For example, a SOI substrate or a material such as glass may be used.

In the above-described Embodiment 1, the case in which the first electrode 60 configures an individual electrode and the second electrode 80 configures a common electrode has been described as an example. However, the first electrode 60 may be configured as a common electrode provided continuously in the direction in which the pressure generation chambers 12 are arranged, and the second electrode 80 may be configured as an individual electrode provided independently corresponding to the pressure generation chamber 12.

In the above-described Embodiment 1, the ink jet recording head has been described as an example of the liquid ejecting head. However, the invention is widely provided for general liquid ejecting heads and can also be applied to liquid ejecting heads which eject a liquid other than an ink. Examples of other liquid ejecting heads include various recording heads which are used in image recording apparatuses such as printers, color material ejecting heads which are used in the manufacturing of color filters of liquid crystal displays and the like, electrode material ejecting heads which are used in the formation of electrodes of organic EL displays and field emission displays (FED), and bioorganic material ejecting heads which are used in the manufacturing of biochips.

In addition, the piezoelectric element described in the above-described Embodiment 1 is not limited to piezoelectric elements used in liquid ejecting heads, and can also be used in other devices. Examples of other devices include ultrasonic measuring apparatuses. Such ultrasonic measuring apparatuses can be configured to have the above-described piezoelectric element 300 and control means for measuring a detection target using a signal based on at least one of ultrasonic waves transmitted by the piezoelectric element 300 and ultrasonic waves received by the piezoelectric element 300.

Furthermore, examples of other devices include various motors, temperature-electricity converters, pressure-electricity converters, ferroelectric transistors, piezoelectric transformers, and filters such as filters for shielding harmful rays such as infrared rays, optical filters using a photonic

The invention claimed is:
1. A piezoelectric material which is expressed as a mixed crystal including a first composition having a perovskite structure and a rhombohedral structure, a second composition having a perovskite structure and a tetragonal structure, and a third composition having a perovskite structure and a tetragonal structure,
   wherein the molar ratio of the first composition having the rhombohedral structure to the second composition and third composition both having the tetragonal structure (rhombohedral crystal/tetragonal crystals) is 0.54 to less than 1.20,
   the first composition having the rhombohedral structure is a first complex oxide which contains Bi in an A-site of the perovskite structure and Fe in a B-site thereof,
   the second composition having the tetragonal structure is formed of a second complex oxide which contains Ba in an A-site of the perovskite structure and Ti in a B-site thereof, and
   the third complex oxide having the tetragonal structure is formed of a third complex oxide which contains Bi and K in an A-site of the perovskite structure and Ti in a B-site thereof.
2. The piezoelectric material according to claim 1,
   wherein the piezoelectric material is expressed as a mixed crystal including $Bi(Fe,Mn)O_3$ as the first complex oxide, $BaTiO_3$ as the second complex oxide, and $(Bi,K)TiO_3$ as the third complex oxide.

3. The piezoelectric material according to claim 1, wherein the first, second, and third compositions are mixed according to the following Formula (1):

$$x\text{Bi(Fe,Mn)O}_3\text{-}y\text{BaTiO}_3\text{-}z(\text{Bi,K})\text{TiO}_3 \qquad (1)$$

(where $0.35 \leq x < 0.55$, $0.20 \leq y \leq 0.35$, and $0.20 \leq z \leq 3.40$).

4. A piezoelectric element comprising:
a first electrode, a piezoelectric layer made of a piezoelectric material, and a second electrode stacked on a substrate, wherein
the piezoelectric material is expressed as a mixed crystal including a first composition having a perovskite structure and a rhombohedral structure, a second composition having a perovskite structure and a tetragonal structure, and a third composition having a perovskite structure and a tetragonal structure,
wherein the molar ratio of the first composition having the rhombohedral structure to the second composition and third composition both having the tetragonal structure (rhombohedral crystal/tetragonal crystals) is 0.54 to less than 1.20,
the first composition having the rhombohedral structure is a first complex oxide which contains Bi in an A-site of the perovskite structure and Fe in a B-site thereof,
the second composition having the tetragonal structure is formed of a second complex oxide which contains Ba in an A-site of the perovskite structure and Ti in a B-site thereof, and
the third complex oxide having the tetragonal structure is formed of a third complex oxide which contains Bi and K in an A-site of the perovskite structure and Ti in a B-site thereof.

5. The piezoelectric material according to claim 4, wherein the piezoelectric material is expressed as a mixed crystal including Bi(Fe,Mn)O$_3$ as the first complex oxide, BaTiO$_3$ as the second complex oxide, and (Bi,K)TiO$_3$ as the third complex oxide.

6. The piezoelectric material according to claim 4, wherein the first, second, and third compositions are mixed according to the following Formula (1):

$$x\text{Bi(Fe,Mn)O}_3\text{-}y\text{BaTiO}_3\text{-}z(\text{Bi,K})\text{TiO}_3 \qquad (1)$$

(where $0.35 \leq x < 0.55$, $0.20 \leq y \leq 0.35$, and $0.20 < z \leq 3.40$).

7. A liquid ejecting head comprising:
the piezoelectric element according to claim 4.

8. A liquid ejecting apparatus comprising:
the liquid ejecting head according to claim 7.

9. An ultrasonic measuring apparatus comprising:
the piezoelectric element according to claim 4; and
a controller configured to measure a subject using a signal based on at least one of ultrasonic waves transmitted by the piezoelectric element and ultrasonic waves received by the piezoelectric element.

* * * * *